(12) United States Patent
Minamio et al.

(10) Patent No.: US 9,265,144 B2
(45) Date of Patent: Feb. 16, 2016

(54) ELECTRICAL COMPONENT RESIN, SEMICONDUCTOR DEVICE, AND SUBSTRATE

(71) Applicant: Panasonic Corporation, Kadoma-shi, Osaka (JP)

(72) Inventors: Masanori Minamio, Osaka (JP); Hiroki Ikeuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/994,253

(22) PCT Filed: Oct. 18, 2012

(86) PCT No.: PCT/JP2012/006652
§ 371 (c)(1),
(2) Date: Jun. 14, 2013

(87) PCT Pub. No.: WO2013/076909
PCT Pub. Date: May 30, 2013

(65) Prior Publication Data
US 2014/0054077 A1    Feb. 27, 2014

(30) Foreign Application Priority Data
Nov. 21, 2011    (JP) .................................. 2011-253383

(51) Int. Cl.
*H05K 1/00* (2006.01)
*H05K 1/03* (2006.01)
(Continued)

(52) U.S. Cl.
CPC ............ *H05K 1/0306* (2013.01); *H01L 23/295* (2013.01); *H01L 23/4275* (2013.01);
(Continued)

(58) Field of Classification Search
CPC . H05K 1/0306; H05K 1/0373; H05K 1/0353; H05K 3/4676; H05K 3/285; H05K 1/0201; H01L 23/49861; H01L 23/4275; H01L 23/4334; H01L 23/49537; H01L 23/49575; H01L 23/49894; H01L 23/295; H01L 23/36; H01L 23/3733; F28D 20/023; C09K 5/14; C09K 5/063
See application file for complete search history.

(56) References Cited

U.S. PATENT DOCUMENTS 3,780,356 A * 12/1973 Laing ............................ 257/714
5,007,478 A *  4/1991 Sengupta ....................... 165/10
(Continued)

FOREIGN PATENT DOCUMENTS

| JP | 56-137098 | 10/1981 |
| JP | 62-001452 | 1/1987 |

(Continued)

OTHER PUBLICATIONS

Chinese Office Action, Jul. 1, 2015; Chinese Patent Application No. 201280006993.2 with English translation of its Search Report (12 pages).

(Continued)

*Primary Examiner* — Steven T Sawyer
(74) *Attorney, Agent, or Firm* — Hamre, Schumann, Mueller & Larson, P.C.

(57) ABSTRACT

A semiconductor device is a resin package structure including a semiconductor element T1 molded with a first resin 6. The first resin 6 contains a filler 7 including an electrical insulating capsule enclosed with a phase-change-material that absorbs ambient heat and phase-changes so as to increase a dielectric-strength. The effect of the filler 7 achieves a structure with satisfactory heat dissipation and a high withstand voltage.

13 Claims, 6 Drawing Sheets (51) Int. Cl.
*H01L 23/29* (2006.01)
*H01L 23/427* (2006.01)
*H01L 23/433* (2006.01)
*H01L 23/495* (2006.01)
*H01L 23/498* (2006.01)
*H05K 3/46* (2006.01)
*H01L 23/31* (2006.01)
*H01L 23/00* (2006.01)
*H05K 1/02* (2006.01)
*H05K 1/18* (2006.01)
*H05K 3/28* (2006.01)

(52) U.S. Cl.
CPC ...... *H01L23/4334* (2013.01); *H01L 23/49537* (2013.01); *H01L 23/49575* (2013.01); *H01L 23/49822* (2013.01); *H01L 23/49861* (2013.01); *H01L 23/49894* (2013.01); *H05K 1/0209* (2013.01); *H05K 1/0256* (2013.01); *H05K 1/0373* (2013.01); *H05K 3/285* (2013.01); *H05K 3/4676* (2013.01); *H01L 23/3107* (2013.01); *H01L 24/32* (2013.01); *H01L 24/48* (2013.01); *H01L 24/73* (2013.01); *H01L 2224/32245* (2013.01); *H01L 2224/48247* (2013.01); *H01L 2224/4903* (2013.01); *H01L 2224/73265* (2013.01); *H01L 2924/3025* (2013.01); *H05K 1/0203* (2013.01); *H05K 1/0224* (2013.01); *H05K 1/186* (2013.01); *H05K 3/284* (2013.01); *H05K 2201/0227* (2013.01); *H05K 2201/0376* (2013.01); *H05K 2201/0723* (2013.01); *H05K 2201/1056* (2013.01); *H05K 2201/10969* (2013.01)

(56) References Cited

U.S. PATENT DOCUMENTS

| | | | | |
|---|---|---|---|---|
| 5,314,005 | A | * | 5/1994 | Dobry .............. 165/10 |
| 5,560,856 | A | * | 10/1996 | Dobry .............. 252/70 |
| 6,147,148 | A | | 11/2000 | Tanaka et al. |
| 6,848,500 | B1 | | 2/2005 | Langari et al. |
| 2002/0033247 | A1 | * | 3/2002 | Neuschutz et al. ......... 165/10 |
| 2003/0129330 | A1 | * | 7/2003 | Alderman ............ 428/34.1 |
| 2004/0007784 | A1 | * | 1/2004 | Skipor et al. .......... 257/788 |
| 2007/0135550 | A1 | | 6/2007 | Chakrapani et al. |
| 2007/0148448 | A1 | * | 6/2007 | Joseph et al. ......... 428/357 |
| 2008/0128922 | A1 | * | 6/2008 | Kotani et al. .......... 257/793 |
| 2008/0191353 | A1 | * | 8/2008 | Japp et al. ............ 257/759 |
| 2009/0109623 | A1 | * | 4/2009 | Jang et al. ........... 361/700 |
| 2009/0278074 | A1 | | 11/2009 | Cox et al. |
| 2010/0159233 | A1 | | 6/2010 | Prack |
| 2013/0096233 | A1 | | 4/2013 | Iwami et al. |

FOREIGN PATENT DOCUMENTS

| | | | | |
|---|---|---|---|---|
| JP | 2003-100969 | | 4/2003 | |
| JP | 2004149796 | A * | 5/2004 | ............ C09K 5/06 |
| JP | 2008-004688 | | 1/2008 | |
| JP | 2009-029962 | | 2/2009 | |
| JP | 2010-509505 | | 3/2010 | |
| JP | 2011-058764 | | 3/2011 | |
| WO | WO 2010/074970 | | 7/2010 | |
| WO | 2011/118584 A1 | | 9/2011 | |

OTHER PUBLICATIONS

Extended European Search Report issued in corresponding European Patent Application No. 12851940.2 on Sep. 8, 2015 (4 pages).

* cited by examiner

ELECTRICAL COMPONENT RESIN, SEMICONDUCTOR DEVICE, AND SUBSTRATE

TECHNICAL FIELD

The present invention relates to an electrical component resin, a semiconductor device including a semiconductor element molded with a resin, and a substrate.

BACKGROUND ART

For example, inverter controllers with smaller sizes and lighter weights have been demanded. Accordingly, resin molding semiconductor devices mounted in inverter controllers have been reduced in size and weight. Moreover, for resin molding semiconductor devices including power semiconductor elements or substrates having electrical components such as semiconductor devices, a high withstand voltage between adjacent electrodes or higher heat dissipation has been demanded.

Figure 11:
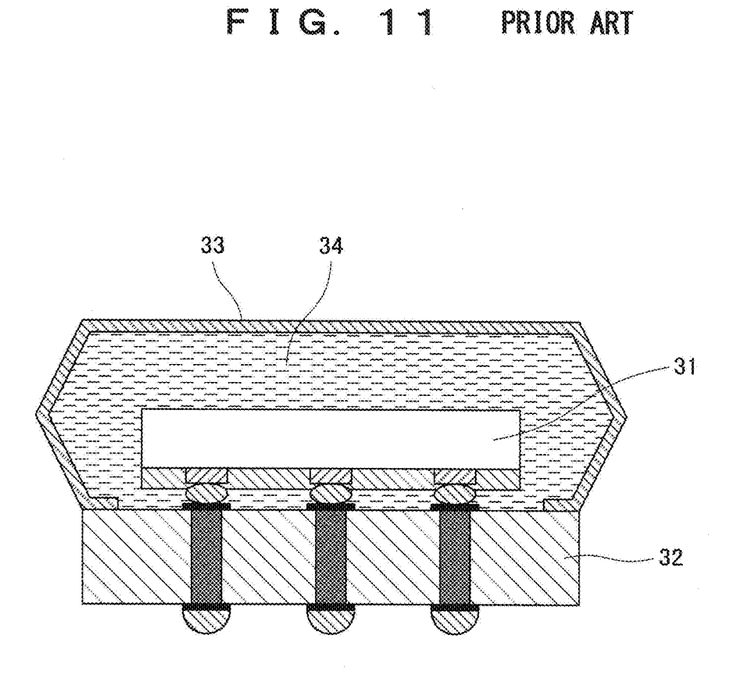
FIG. 11 is an enlarged cross-sectional view illustrating a semiconductor device of Patent Literature 1.

In a resin molding semiconductor device, heat dissipation from a chip to the top surface of a package is restricted by the heat conductivity of a resin used for molding. Thus, in Patent Literature 1, as shown in FIG. 11, a metallic case 33 covering a chip 31 is mounted on a substrate 32 and is filled with a coolant 34 in the metallic case 33. In the resin molding semiconductor device of Patent Literature 1, heat generated from the chip 31 is transmitted to the case 33 by the heat convection of the coolant 34, achieving higher heat conduction to the outside than in a conventional resin molding semiconductor device.

Figure 12:
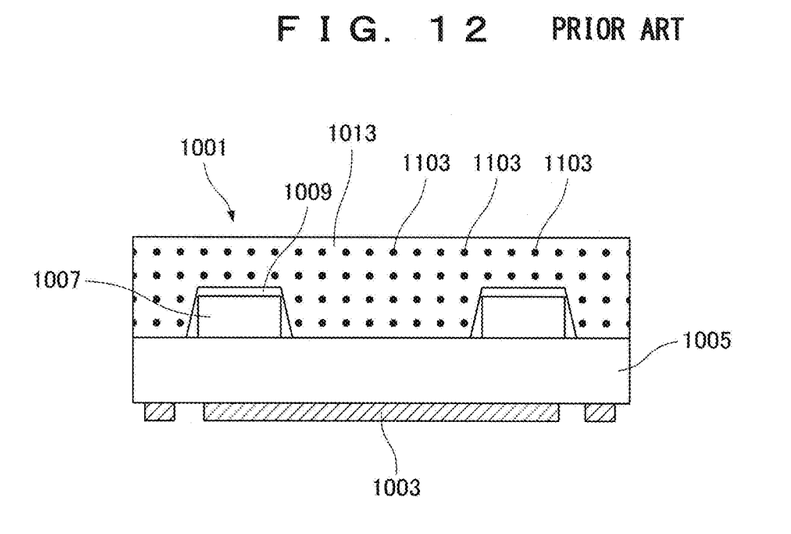
FIG. 12 is an enlarged cross-sectional view illustrating a semiconductor device of Patent Literature 2.

In a cooling system for a pulsed power semiconductor described in Patent Literature 2, heat is absorbed by a molding material containing microcapsules of a phase-change-material. FIG. 12 is a schematic cross-sectional view illustrating a semiconductor device 1001 disclosed in Patent Literature 2. The semiconductor device 1001 includes a radiator plate 1003, a substrate 1005, and elements 1007. The elements 1007 mounted on the substrate 1005 are molded with a molding material 1013. The molding material 1013 contains microcapsules of a phase-change-material 1103. For example, epoxy resin is disclosed as the molding material 1013. A heat conducting material 1009 is applied between the element 1007 and the molding material 1013. The elements 1007 and the molding material 1013 are thermally coupled by the heat conducting material 1009.

CITATION LIST

Patent Literature

Patent Literature 1: Japanese Patent Laid-Open No. 2008-4688

Patent Literature 2: the specification of U.S. Pat. No. 6,848,500

SUMMARY OF INVENTION

Technical Problem

However, in the resin molding semiconductor device of Patent Literature 1, the case 33 may be filled with the coolant 34 by a complicated process. Since the coolant 34 is a fluorine-based inert liquid or ethanol having a high dielectric constant, heat dissipation and a dielectric-strength may be limited.

The semiconductor device in Patent Literature 2 is configured regardless of a dielectric-strength, making it difficult to obtain a high withstand voltage.

An object of the present invention is to provide an electrical component resin, a semiconductor device, and a substrate that can obtain satisfactory heat dissipation and a high withstand voltage.

Solution to Problem

In order to solve the problem, an electrical component resin according to the present invention is composed of an electrical insulating resin containing a filler, the filler is formed by enclosing a phase-change-material that changes a dielectric-strength by phase-change by heat absorption, in a capsule of electrical insulation.

Moreover, in order to solve the problem, a semiconductor device according to the present invention includes a semiconductor element molded with the electrical component resin.

Furthermore, in order to solve the problem, a substrate according to the present invention has a conductor pattern on a base substrate composed of the electrical component resin.

Moreover, in order to solve the problem, another substrate according to the present invention includes an electric circuit composed of layers of the electrical component resin containing one of an electrical component and a conductor pattern, the layers being stacked sequentially or with an intermediate layer interposed between the layers.

Advantageous Effect of Invention

The present invention can provide an electrical component resin, a semiconductor device, and a substrate that can achieve satisfactory heat dissipation and a high withstand voltage.

DESCRIPTION OF EMBODIMENTS

First Embodiment

Figure 1:
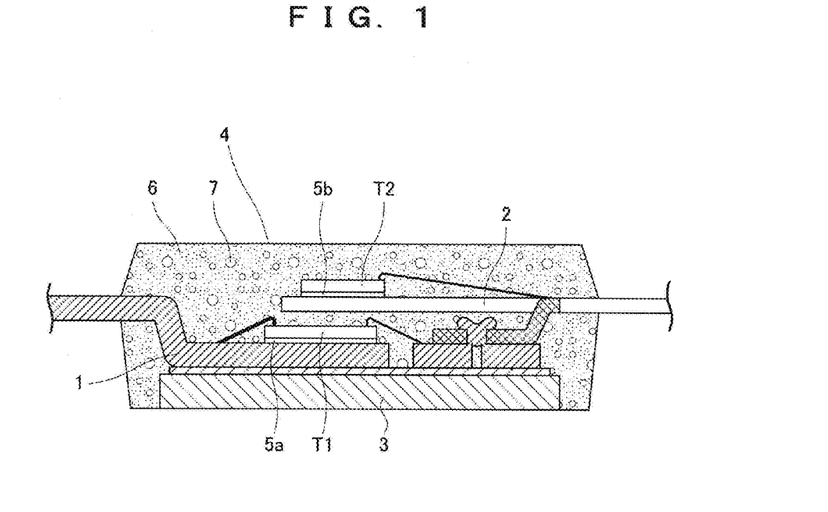
FIG. 1 is an enlarged cross-sectional view illustrating a semiconductor device according to a first embodiment of the present invention.

FIG. 1 illustrates a first semiconductor device according to a first embodiment. The first semiconductor device in FIG. 1 is a resin molding semiconductor device that is an example of a structure molded with an electrical insulating resin for an electrical component.

The first semiconductor device includes a power element T1 fixed on a first lead frame 1, and a control element T2 fixed on a second lead frame 2. The first and second lead frames 1 and 2 are fixed on insulating sheets 5a and 5b above the top surface of a radiator plate 3. The power element T1 and the control element T2 are examples of a semiconductor element. The insulating sheets 5a and 5b are made of, for example, electrical insulating materials with heat conduction. The insulating sheets 5a and 5b each have a three-layer structure including an electrical insulating layer sandwiched between adhesive layers. A package 4 joins the first lead frame 1 and the second lead frame 2 and protects the power element T1 and the control element T2. The package 4 contains a first resin 6 that is an example of a thermosetting resin such as epoxy. The first resin 6 contains a filler 7 that is a feature of the present invention. The filling factor of the filler 7 in the first resin 6 of the first embodiment is set at 20% to 80% depending upon a heat absorbing or insulating characteristic and the material characteristic of the first resin 6, which will be described later.

According to the present invention, the resin for molding (e.g., the first resin 6) desirably has moldability and a higher dielectric constant than the filler 7. The use of the resin and the filler 7 can achieve a dielectric-strength characteristic according to an instant voltage increase in the semiconductor device.

Figure 2:
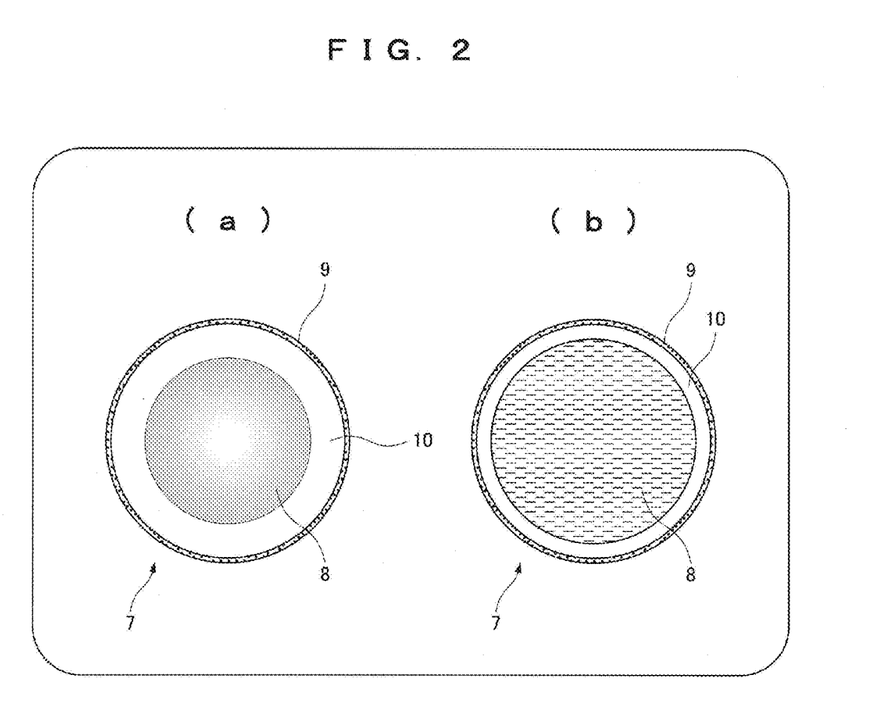
FIG. 2 is an enlarged cross-sectional view illustrating a filler according to the first embodiment of the present invention.

As shown in FIG. 2(a), the filler 7 is configured such that an electrical insulating capsule 9 contains a phase-change-material 8 that phase-changes when absorbing ambient heat. FIG. 2(a) is an enlarged cross-sectional view illustrating the filler at room temperature. At room temperature in FIG. 2(a), the phase-change-material 8 is solid. FIG. 2(b) illustrates the filler 7 that absorbs heat generated from the power element T1 and so on. When heat is absorbed as shown in FIG. 2(b), the phase-change-material 8 is liquid.

Specifically, the filler 7 includes the silica ($SiO_2$) capsule 9 enclosed with erythritol serving as the phase-change-material 8. In the first embodiment, the capsule 9 has a diameter of 60 μm. According to the present invention, the capsule 9 can be 2 μm to 100 μm in diameter. Furthermore, the capsule 9 has a thickness of 0.1 μm to 20 μm. In the first embodiment, the phase change material 8 in the capsule 9 is erythritol whose volume is 60% of the capacity of the capsule 9. The volume of erythritol serving as the phase change material 8 is desirably 30% to 70% relative to the capacity of the capsule 9. A gas layer 10 is provided between the capsule 9 and the phase change material 8. The gas layer 10 may contain various kinds of inert gas or air. In the first embodiment, the gas layer 10 contains air having an excellent insulating property.

As shown in FIG. 2(a), erythritol is solid at room temperature and phase-changes into a liquid state at a melting point of 118° C. The melting point of erythritol, which is an example of the phase change material 8, is lower than 125° C. that is the heatproof temperature of the power element T1. In other words, in the first embodiment, the melting point of the phase change material 8 is lower than the heatproof temperature of the power element T1. In the present invention, the melting point of the phase change material 8 is lower than the heatproof temperature of the power element T1 and thus heat is absorbed by the phase change material 8, reducing the possibility that the temperature of the first semiconductor device may exceed the heatproof temperature of the power element T1. The capsule 9 is resistant to the expansion of the molten phase change material 8, preventing the phase change material 8 from flowing to the outside.

Figure 3:
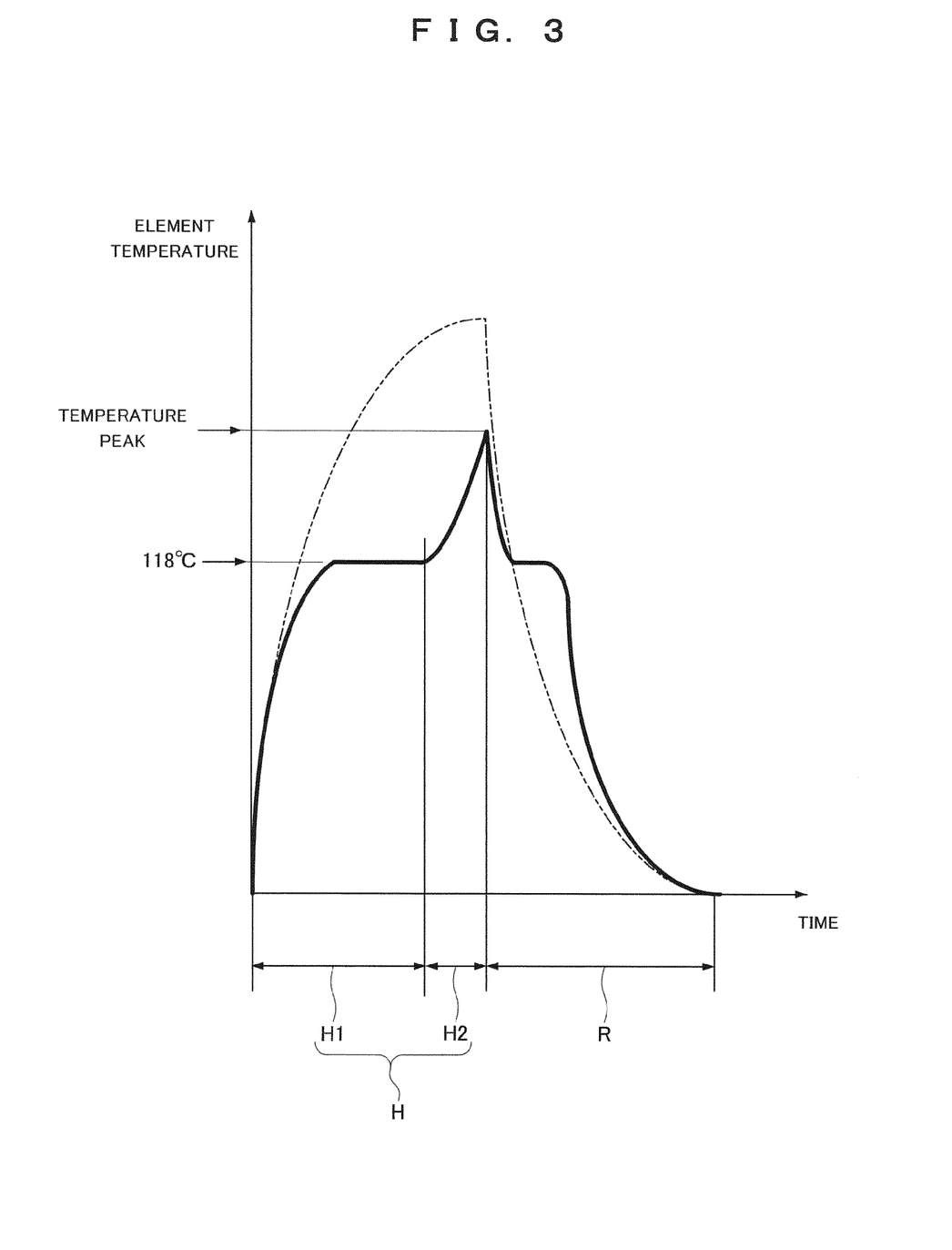
FIG. 3 is a temperature characteristic diagram of heat absorption and heat dissipation when heat is generated from a semiconductor element according to the first embodiment of the present invention.
Figure 9:
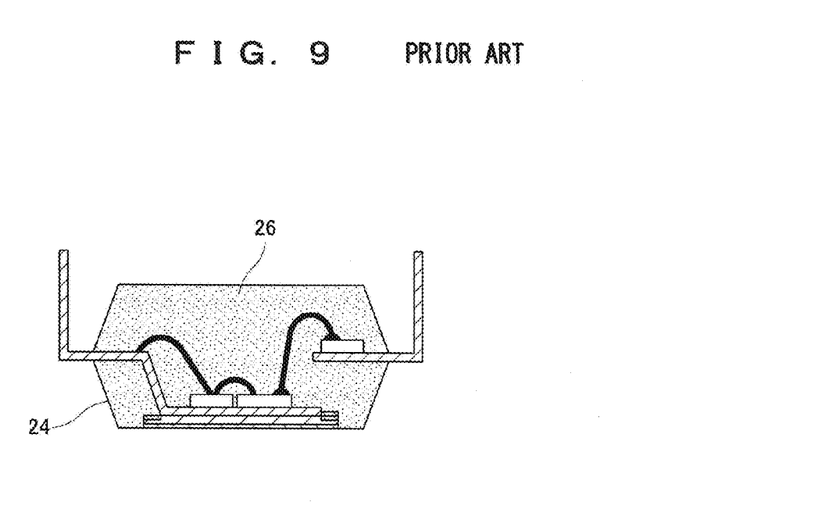
FIG. 9 is an enlarged cross-sectional view illustrating a semiconductor device according to the related art.
Figure 10:
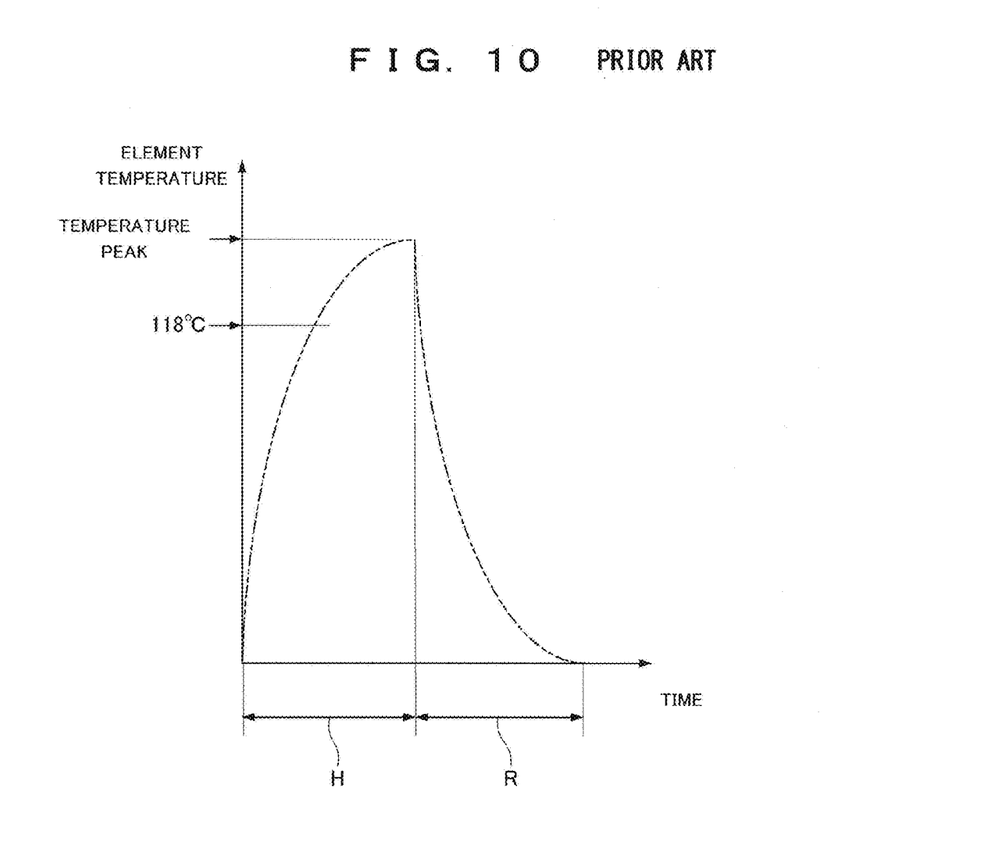
FIG. 10 is a temperature characteristic diagram of heat absorption and heat dissipation when heat is generated from a semiconductor element according to the related art.

Referring to FIGS. 3, 9, and 10, the temperature of the first semiconductor device according to the present invention is less likely to increase than in the related art.

FIG. 3 is a temperature characteristic diagram of heat absorption and heat dissipation when heat is generated from the semiconductor element according to the first embodiment of the present invention. FIG. 9 is an enlarged cross-sectional view illustrating a semiconductor device according to the related art. FIG. 10 is a temperature characteristic diagram showing heat absorption and heat dissipation when heat is generated from a semiconductor element according to the related art.

In the first semiconductor device according to the first embodiment, the first resin 6 containing the filler 7 is used. Thus, when heat is generated from the power element T1 so as to increase the temperature of the first resin 6 in the first semiconductor device according to the first embodiment, the temperature rises as indicated by a solid line in FIG. 3 and then reaches 118° C., the melting point of erythritol. At this point, the temperature stops rising. This is because the phase change material 8 (erythritol) melts and phase-changes from a solid state to a liquid state, and then the phase change material 8 absorbs the heat of fusion according to the phase change so as to rapidly reduce the inclination of the temperature increase around the melting point of erythritol. Thus, the first semiconductor device according to the first embodiment has characteristics shown in FIG. 3. Furthermore, the time of arrival at a temperature peak exceeding the heat proof temperature of the power element T1 can be delayed.

In other words, in the first semiconductor device according to the present invention, microcapsules containing the phase change material are mixed in a desired resin, achieving satisfactory heat dissipation and an improved dielectric-strength. Specifically, the satisfactory heat dissipation is heat absorption when the first semiconductor device rapidly increases in temperature. To improve a dielectric-strength is to prevent a concentration of an electric field in a space and reduce a dielectric constant in response to a voltage increase, which is disadvantageous when the first semiconductor device is momentarily driven.

On the solid line in FIG. 3, "period H" is a heat generation period having a power loss and "period R" is a heat dissipation period during which a temperature stops rising and then decreases in response to heat generation. Moreover, in "period H1", a part of the period H, heat is absorbed according to a phase change of the phase change material 8 so as to stop a temperature increase. In "period H2", a part of the period H, heat cannot be absorbed by the phase change material 8 and thus the temperature of the first semiconductor device increases. The relationship between "period H1" and "period H2" depends upon the amount of the phase change material 8 in the filler 7. As the amount of the phase change material 8 increases, "period H1" is extended.

A virtual line (chain double-dashed line) in FIG. 3 indicates a temperature increase in the related art of FIG. 10. Specifically, the virtual line in FIG. 3 indicates a temperature increase of a comparative example in which a first resin does not contain the filler 7.

The use of the first resin 6 in the first embodiment can prevent the package 4 from reaching the temperature peak, improving reliability according to a temperature increase of the semiconductor device. For example, in the case of a semiconductor device for a driver of a motor driving inverter, the first resin 6 of the first embodiment can reduce the influence of a temperature when a system counter electromotive force is applied. This can improve the performance of a motor even in the case of an inverter having the same outside dimensions as in the related art.

Furthermore, the first resin 6 containing the filler 7 of the present invention has a high dielectric-strength during heat generation. The dielectric-strength will be compared with that in a comparative example of the semiconductor device according to the related art in FIG. 9. The semiconductor device according to the related art in FIG. 9 includes a package 24 that contains a thermosetting resin 26 only composed of epoxy.

While epoxy has a dielectric constant of "4", the capsule 9 (silica) of the filler 7 has a dielectric constant of "2.5" and the phase change material 8 (erythritol) has a dielectric constant of "1.5". Thus, in the semiconductor device according to the first embodiment, the dielectric constant of the filler 7 is lower than that of epoxy, thereby improving a dielectric-strength between electrodes in the semiconductor device.

Comparing with ethanol used as a coolant 34 in the semiconductor device of Patent Literature 1, ethanol having a dielectric constant of "24" allows the semiconductor device of the first embodiment to considerably increase a dielectric-strength between the electrodes.

Second Embodiment

FIGS. 4 to 8 illustrate substrates as examples of a structure that contains the electrical component resin according to the first embodiment as an insulating resin. Structures in FIGS. 4 to 8 will be described as first to fifth examples. The same constituent elements as in the first embodiment are indicated by the same reference numerals.

First Example

Figure 4:
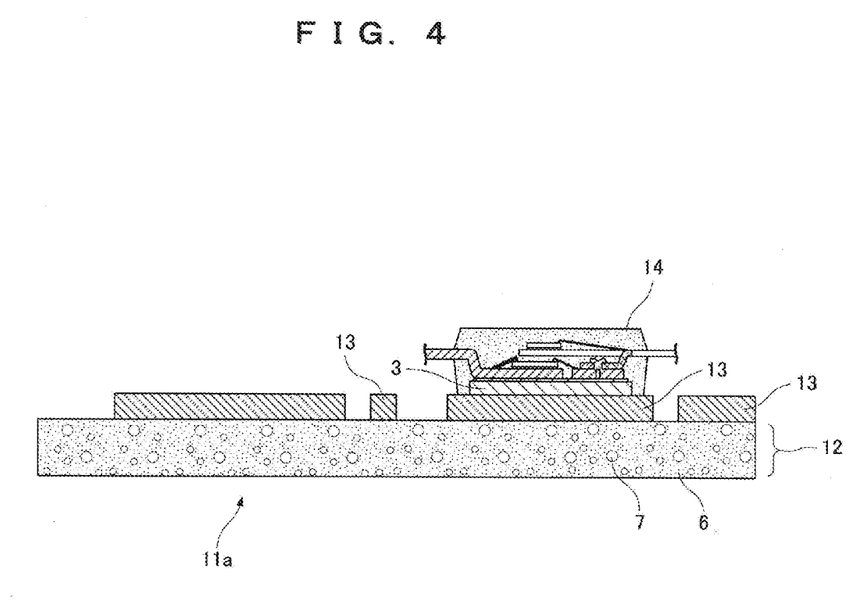
FIG. 4 is an enlarged cross-sectional view illustrating a first example of a substrate according to a second embodiment of the present invention.

A substrate 11a according to a first example in FIG. 4 has a conductor pattern 13 on the top surface of a base substrate 12. An electrical insulating first resin 6 constituting the base substrate 12 contains a filler 7. As in the first embodiment, the filler 7 includes an insulating capsule 9 containing a phase change material 8 that phase-changes when absorbing heat. A semiconductor device 14 includes a radiator plate 3 thermally coupled to the conductor pattern 13 to dissipate heat through the conductor pattern 13.

An electrical component resin constituting the base substrate 12 is the insulating first resin 6 containing the filler 7. Thus, heat from the semiconductor device 14 can be dissipated through the base substrate 12 by the absorption of heat of fusion by the phase change material 8. This can delay the time of arrival at a temperature peak exceeding the heatproof temperature of the semiconductor device 14, protecting the semiconductor device 14 from thermal destruction.

Second Example

Figure 5:
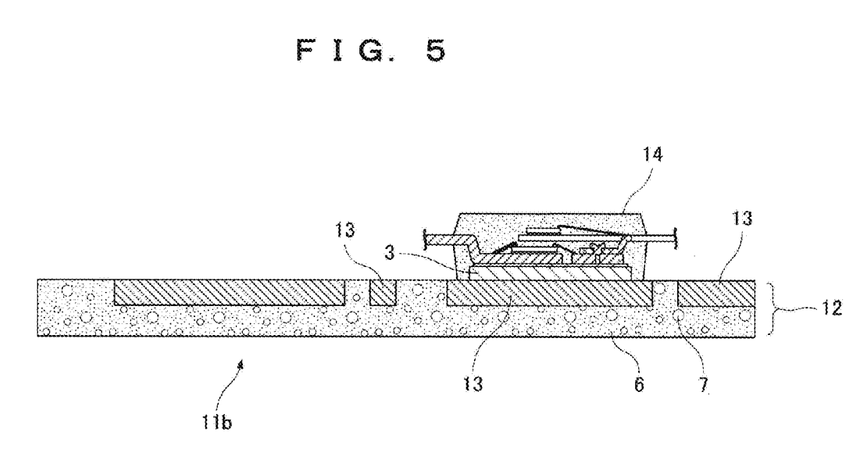
FIG. 5 is an enlarged cross-sectional view illustrating a substrate of a second example.

A substrate 11b according to a second example in FIG. 5 is different from the first example only in that the conductor pattern 13 is embedded in the base substrate 12.

Third Example

Figure 6:
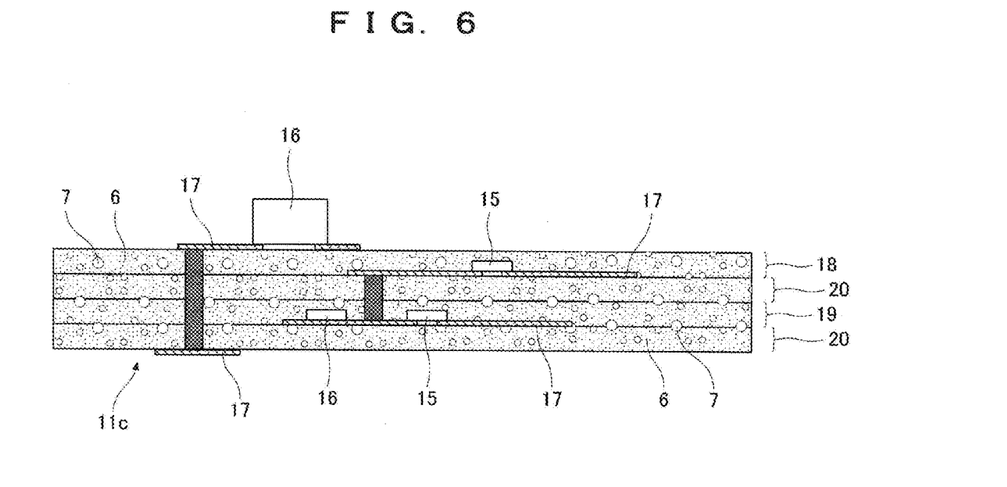
FIG. 6 is an enlarged cross-sectional view illustrating a substrate of a third example.

A substrate 11c according to a third example in FIG. 6 is a multi-layer substrate containing an inner layer circuit. The substrate 11c includes layers 18 and 19 stacked with an intermediate layer 20 interposed between the layers 18 and 19, which constitutes an electric circuit. The layers 18 and 19 each contain an electrical component of an active element 15 or a passive element 16 or a conductor pattern 17. In the third example, the first resin 6 constituting at least one of the layers 18 and 19 and the intermediate layer 20 contains the filler 7.

The electrical component resin constituting the layers 18 and 19 and the intermediate layer 20 contains the filler 7. Thus, heat of fusion is absorbed by the phase change material 8 in the filler 7 so as to protect the electrical component from thermal destruction and obtain a promising shielding effect in a high-frequency band. The shielding effect in the high-frequency band is a lower dielectric constant in the filler 7 than in the first resin 6.

Fourth Example

Figure 7:
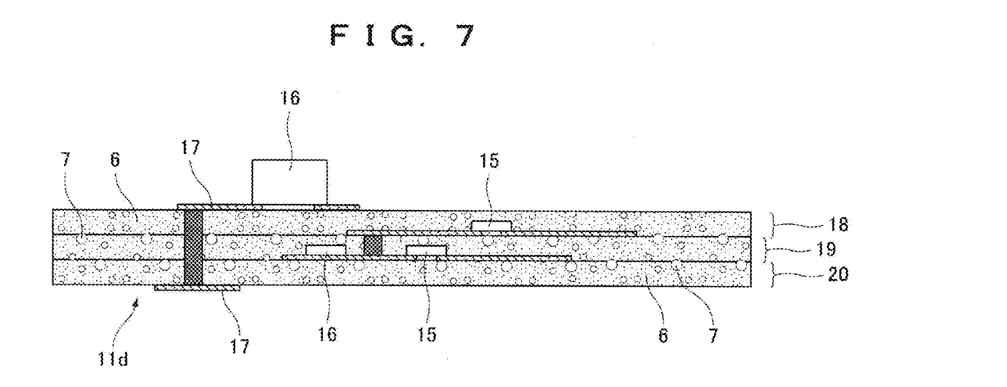
FIG. 7 is an enlarged cross-sectional view illustrating a substrate of a fourth example.

A substrate 11d according to a fourth example in FIG. 7 is different from the third example only in that the layers 18 and 19 are stacked without the intermediate layer 20 interposed therebetween.

Fifth Example

Figure 8:
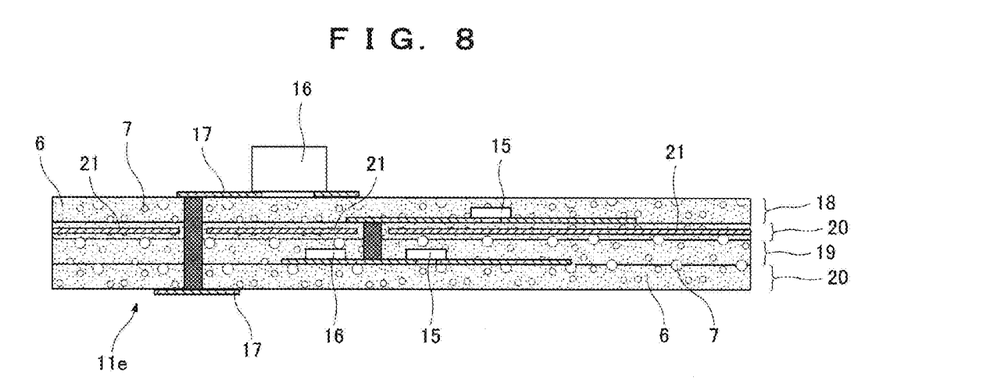
FIG. 8 is an enlarged cross-sectional view illustrating a substrate of a fifth example.

A substrate 11e according to a fifth example in FIG. 8 is different from the third example only in that the intermediate layer 20 contains a shield layer 21 that blocks the passage of an electromagnetic wave.

In the foregoing embodiments and examples, the capsule 9 of the filler 7 is made of silica (SiO2). The capsule 9 of the filler 7 may be made of organic materials such as electrical insulating melamine and silicone.

In the foregoing embodiments, the phase change material 8 of the filler 7 is erythritol that phase-changes at a temperature lower than the heatproof temperature of an electrical component serving as an element to be used. Other sugar alcohols may be used with a dielectric constant smaller than that of the contained resin. For example, the other sugar alcohols may be sorbitol or xylitol, or the phase change material 8 of the filler 7 may be phase change materials such as paraffin having a dielectric constant of about "2" and a melting point of about "70° C." or polyethylene having a dielectric constant of about "2.3" and a melting point of about "125° C.". In any cases, the heat absorbing property and the heat dissipating property can be adjusted by an adjustment on an additive and the amount of the additive.

In the substrate or the multilayer substrate according to the foregoing embodiments, the filler 7 is contained over the substrate. The electrical insulating first resin containing the filler 7 may be similarly used in preimpregnation as a matrix resin for impregnation of a base material, e.g., glass fibers or carbon fibers.

In the foregoing embodiments, the heat of fusion of the phase change material 8 is latent heat necessary for a phase change from solid to liquid. In the case of the phase change material 8 having an intermediate phase condition of solid and liquid, the heat of fusion may be only latent heat necessary for a phase change from solid to the intermediate phase condition or only latent heat necessary for a phase change from the intermediate phase condition to liquid.

In the foregoing embodiments, the filler 7 has the gas layer 10 between the phase change material 8 and the capsule 9. A liquid layer or a gel layer may be provided between the phase change material 8 and the capsule 9. In this case, the layer between the phase change material 8 and the capsule 9 requires a dielectric constant equal to or lower than that of the first resin 6, which is an example of resin.

INDUSTRIAL APPLICABILITY

The present invention contributes to a size reduction of various inverters for air conditioners requiring high power control, and an improvement of reliability of electrical structures under poor service conditions.

The invention claimed is:

1. An electrical component resin comprising: a plurality of particles of a phase-change-material that phase-changes by heat absorption; the plurality of phase-change-material particles being individually encapsulated with a first electrical insulating material that encloses the phase-change-material to form capsules, with a diameter between 2 micrometers and 100 micrometers; a layer provided between each capsule and the encapsulated phase-change-material and partially enclosing the phase-change-material; and a resin formed of a second electrical insulating material and enclosing the capsules; wherein the layer is composed of inert gas different from the phase-change-material; a substrate comprising an electric circuit composed of layers of the electrical component resin, the electrical component resin containing one of an electrical component and a conductor pattern, the layers being stacked sequentially or with an intermediate layer interposed between the layers.

2. The electrical component resin according to claim 1, wherein the phase-change-material increases in dielectric-strength by phase-changing by heat absorption.

3. The electrical component resin according to claim 1, wherein a thickness of the layer reduces when the phase-change-material phase-changes by heat absorption.

4. The electrical component resin according to claim 1, wherein the phase-change-material has a smaller dielectric constant than the resin.

5. The electrical component resin according to claim 1, wherein the phase-change-material changes phase at a temperature lower than a heatproof temperature of an electrical component to be used.

6. The electrical component resin according to claim 1, wherein the first electrical insulating material is made of silica, and the phase-change-material is a sugar alcohol.

7. The electrical component resin according to claim 1, wherein the phase-change-material is erythritol.

8. The electrical component resin according to claim 1, wherein the phase-change-material is one of sorbitol, xylitol, paraffin, and polyethylene.

9. A semiconductor device comprising a semiconductor element molded with the electrical component resin according to claim 1.

10. A substrate having a conductor pattern on a base substrate composed of the electrical component resin according to claim 1.

11. The electrical component resin according to claim 2, wherein a thickness of the layer reduces when the phase-change-material phase-changes by heat absorption.

12. The electrical component resin according to claim 1, wherein the phase-change-material changes in dielectric-strength by phase-changing by heat absorption.

13. The electrical component resin according to claim 1, wherein the capsule has a wall thickness of 0.1 micrometers to 20 micrometers.

\* \* \* \* \*